United States Patent
Van Eijk et al.

(10) Patent No.: US 8,982,359 B2
(45) Date of Patent: Mar. 17, 2015

(54) SYSTEM FOR DETECTING MOTION, LITHOGRAPHIC APPARATUS AND DEVICE MANUFACTURING METHOD

(75) Inventors: Jan Van Eijk, Eindhoven (NL); Erik Roelof Loopstra, Eindhoven (NL); Engelbertus Antonius Fransiscus Van Der Pasch, Oirschot (NL); Johannes Petrus Martinus Bernardus Vermeulen, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 311 days.

(21) Appl. No.: 13/564,665

(22) Filed: Aug. 1, 2012

(65) Prior Publication Data

US 2013/0194586 A1    Aug. 1, 2013

Related U.S. Application Data

(60) Provisional application No. 61/527,176, filed on Aug. 25, 2011.

(51) Int. Cl.
| | | |
|---|---|---|
| G01B 11/14 | (2006.01) | |
| G01B 11/24 | (2006.01) | |
| G01D 5/38 | (2006.01) | |
| G03F 7/20 | (2006.01) | |

(52) U.S. Cl.
CPC .... *G01B 11/14* (2013.01); *G01D 5/38* (2013.01); *G03F 7/70775* (2013.01)
USPC ............................. 356/614; 356/615; 356/622

(58) Field of Classification Search
USPC ............ 356/237.1–241.6, 242.1–243.8, 356/426–431, 600–640
See application file for complete search history.

(56) References Cited

U.S. PATENT DOCUMENTS

| | | | |
|---|---|---|---|
| 4,074,131 A | | 2/1978 | Schwebel |
| 4,780,617 A | * | 10/1988 | Umatate et al. ............... 250/548 |
| 5,151,750 A | * | 9/1992 | Magome et al. ............... 356/401 |
| 5,610,715 A | * | 3/1997 | Yoshii et al. ................... 356/499 |
| 5,689,339 A | * | 11/1997 | Ota et al. ....................... 356/401 |
| 5,721,607 A | * | 2/1998 | Ota .................................. 355/53 |
| 6,198,527 B1 | * | 3/2001 | Nishi ............................... 355/53 |
| 6,819,433 B2 | * | 11/2004 | Takai et al. .................... 356/500 |
| 7,512,452 B2 | * | 3/2009 | Mauro ............................. 700/60 |
| 7,884,918 B2 | * | 2/2011 | Hattori ............................ 355/52 |
| 8,208,128 B2 | * | 6/2012 | Makinouchi .................... 355/72 |
| 8,274,639 B2 | * | 9/2012 | Shibazaki ........................ 355/72 |
| 8,390,820 B2 | | 3/2013 | Klaver et al. |
| 8,488,106 B2 | * | 7/2013 | Shibazaki et al. ............... 355/72 |
| 2002/0018192 A1 | * | 2/2002 | Nishi ............................... 355/53 |
| 2006/0282179 A1 | | 12/2006 | Mauro |
| 2008/0282566 A1 | | 11/2008 | Holzapfel |
| 2008/0285050 A1 | | 11/2008 | Hermann |

FOREIGN PATENT DOCUMENTS

| | | |
|---|---|---|
| EP | 1 865 291 A2 | 12/2007 |
| JP | 2007-292725 A | 11/2007 |
| WO | WO 2007/034379 A2 | 3/2007 |
| WO | WO 2009/133702 A1 | 11/2009 |

* cited by examiner

*Primary Examiner* — Kara E Geisel
*Assistant Examiner* — Jarreas C Underwood
(74) *Attorney, Agent, or Firm* — Sterne, Kessler, Goldstein & Fox P.L.L.C.

(57) ABSTRACT

A system for detecting motion of a body, the system comprising: a body; a first grating mounted substantially stationary relative to a frame of reference; a second grating mounted on the body; a detector arranged to receive one or more radiation beams diffracted at the first and second gratings thereby to detect motion of the body relative to the frame of reference; wherein the detector is coupled to the body and moveable relative to the body.

17 Claims, 8 Drawing Sheets

US 8,982,359 B2

SYSTEM FOR DETECTING MOTION, LITHOGRAPHIC APPARATUS AND DEVICE MANUFACTURING METHOD

CROSS REFERENCE TO RELATED APPLICATIONS

This application claims the benefit under 35 U.S.C. §119 (e) to U.S. Provisional Patent Application No. 61/527,176, filed Aug. 25, 2011, which is incorporated by reference herein in its entirety.

FIELD

The present invention relates to a system for detecting motion, a lithographic apparatus, and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"—direction) while synchronously scanning the substrate parallel or anti parallel to this direction. It is also possible to transfer the pattern from the patterning device to the substrate by imprinting the pattern onto the substrate.

Conventionally known precision sensors, such as interferometers, may provide accurate position measurements. However, the accuracy of conventional interferometers is limited by disturbances in the air through which the radiation beam of the interferometer passes. Such disturbances may include air turbulence and thermal variations. Accordingly, the accuracy of conventional interferometers can only be increased by minimizing such disturbances. However, minimizing such disturbances, such as by introducing delays in order to allow the air turbulence to decrease and/or to allow the temperature of the air to settle to within a required value, reduces the throughput of a lithographic apparatus and, accordingly, increases the cost of using the apparatus.

One way to reduce the disturbances is to limit the length of the air path in the measurement beams. This may be done by using large two dimensional Grid Plates above the substrate table with substrate table mounted encoders or by using an array of detectors. Both solutions require large volume and cost.

Furthermore, any measurement system may only occupy a limited volume of space within the lithographic apparatus.

SUMMARY

It is desirable to provide an improved precision measurement system that is less susceptible to errors but which does not occupy a large amount of space.

According to an aspect of the present invention, there is provided a system for detecting motion of a body, the system comprising: a body, a first grating mounted substantially stationary relative to a frame of reference, a second grating mounted on the body, a detector arranged to receive one or more radiation beams diffracted at the first and second gratings thereby to detect motion of the body relative to the frame of reference, wherein the detector is coupled to the body and moveable relative to the body.

According to another aspect of the present invention, there is provided a lithographic apparatus comprising such a positioning device.

According to a further aspect of the present invention, there is provided a system for detecting motion of a body, the system comprising: a body, a first grating mounted substantially stationary relative to a frame of reference, a second grating mounted on the body, a detector arranged to receive one or more radiation beams diffracted at the first and second gratings thereby to detect motion of the body relative to the frame of reference, at least one guide adapted to guide the detector in a direction substantially parallel to an elongate direction of the first grating, and an actuator adapted to move the detector in a direction substantially parallel to the elongate direction.

According to a still further aspect of the present invention, there is provided a device manufacturing method comprising: irradiating a substrate positioned on a substrate table using a projection system and measuring a movement of the substrate relative to the projection system using one of the above systems.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
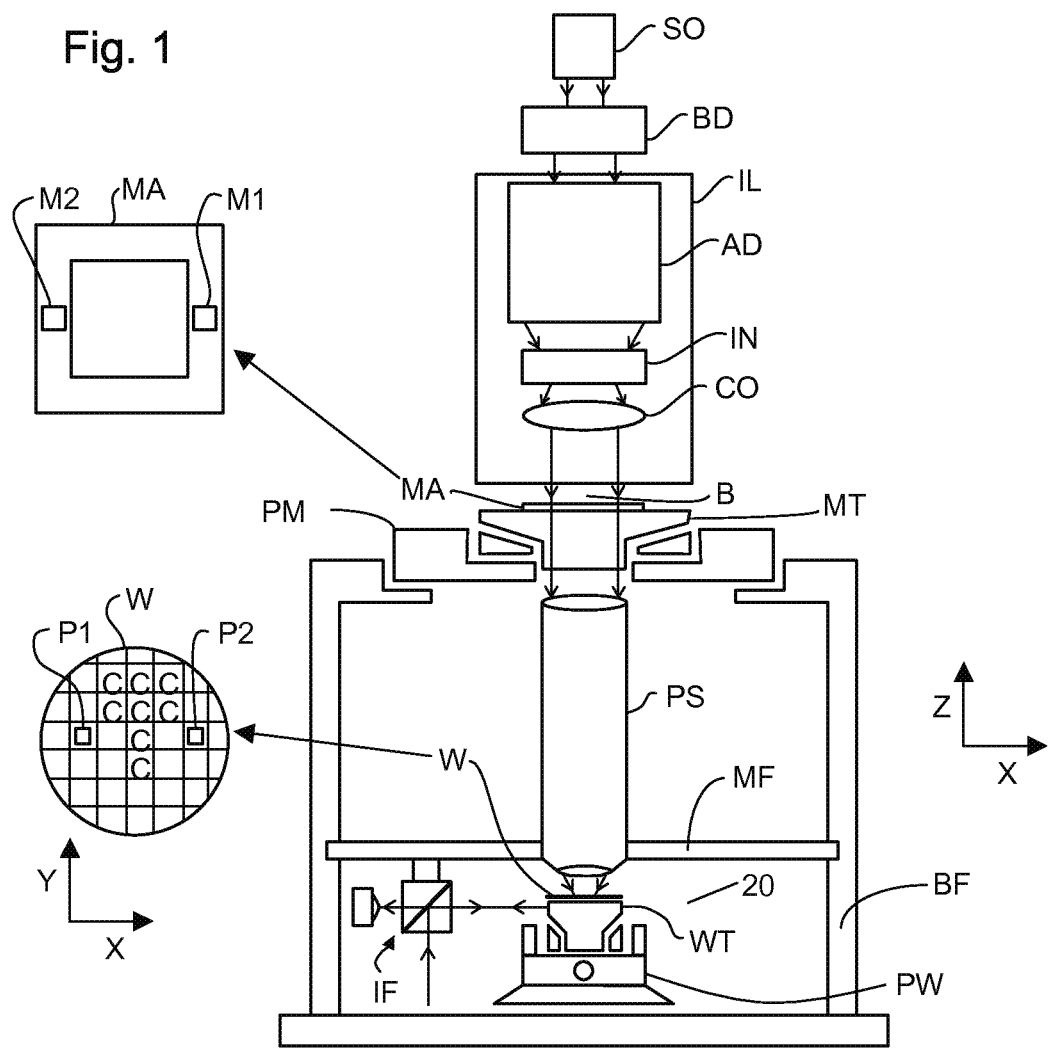
FIG. 1 depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the present invention. The apparatus comprise an illumination system (illuminator) IL configured to condition a radiation beam B (e.g. UV radiation or EUV radiation), a support structure (e.g. a mask table) MT constructed to support a patterning device (e.g. a mask) MA and connected to a first positioner PM configured to accurately position the patterning device in accordance with certain parameters, a second support structure, in particular a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device.

It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT and/or substrate table WT may be realized with the aid of long-stroke actuator systems (coarse positioning) and short-stroke actuator systems (fine positioning), which form part of the first and second positioners PM, PW. This is discussed in further detail below. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

WO 2007/034379, hereby incorporated in its entirety by reference, discloses a system for detecting motion of a body. A first grating is mounted substantially stationary relative to a frame of reference and a second grating is mounted on the body whose motion is desired to be detected. A detector is arranged to receive one or more radiation beams diffracted at the first and second gratings thereby to detect motion of the body relative to the frame of reference. The first and/or second gratings may be reflective or transmissive, dependent upon the arrangement of the radiation beams and detector. In an embodiment the detector is moveable. The only constraint is that the detector receives the radiation beams which have been diffracted by the first and second gratings. For example, the detector should be above or below an intersection of the two gratings, but may move relative to the intersection.

EP-A2-1,865,291, hereby incorporated in its entirety by reference, discloses a system based on the same principles described in WO 2007/034379 in which the detector is stationary requiring the gratings to be of a large size.

The present invention may uses, for example, the detection principles described in WO 2007/034379 and EP-A2-1,865, 291. The total size of grating is maintained low. This aids in keeping the cost of the system low, easing manufacturability as well as keeping the time for calibration low. The system uses a moveable detector. In an embodiment the detector comprises an emitter of one or more radiation beams and a sensor for sensing the one or more radiation beams after they have been diffracted at the first and second gratings.

No description is given in WO 2007/034379 of how to arrange a moveable detector. The moveable detector in WO 2007/034379 is positioned above both gratings. However, at this position space is very limited in a lithographic apparatus so implementation of such a system is difficult. The below embodiment address these issues.

The principles may be applied in a lithographic apparatus, as described in the exemplary embodiments. The frame of reference may be chosen to be the metrology frame MF shown in FIG. 1 and to which the projection system PS is coupled. The body whose motion is detected may be the substrate table WT on which the substrate W is positioned and which is part of the substrate stage 20.

In a lithographic apparatus a substrate table may move in a plane (x, y) substantially perpendicular to the optical axis of the projection system PS. In an embodiment the movement of the substrate table WT may be greater in the y direction than in the x direction.

Because of the lack of space in a lithographic projection apparatus, it is desirable that the first grating is positioned above the substrate table WT. Desirably the second grating is mounted on the substrate table WT and below the first grating. Desirably the detector is positioned beneath the second grating.

In an embodiment the detector is under an intersection of the first and second grating. In an embodiment the first grating is elongate in a first direction (for example the y direction) and the second grating is elongate in a second direction (for example the x direction). In an embodiment the first and second directions are orthogonal. In an embodiment the first and second gratings are elongate in the x and y directions respectively. The below description assumes that the first grating is elongate in the y direction, but the principles are equally applicable where the first grating is elongate in the x direction.

In an embodiment where the first grating is elongate in the y direction and the second grating elongate in the x direction, the detector is moveable in the y direction. The detector is constrained in at least in the x direction relative to the first grating. The detector may be constrained in the other five degrees of freedom (y, z, Rx, Ry, Rz) relative to the first grating, except for the y direction. The constraint is effective for the detector to remain under the first grating (and second grating) in all y positions. The constraint may allow some movement in the degree of freedom constrained. This is because the intersect of the first and second gratings has an area and the detector can move in that area. The beams of radiation (e.g. light) of the detector can be diffracted at any position.

In an embodiment the need to constrain and move the detector by coupling the detector is addressed to the substrate stage 20 (in the embodiments of FIGS. 2-4, 7 and 8) or by using a guide on the metrology frame MF and an actuator acting between a frame (e.g. the metrology frame MF or base frame BF) and the detector.

FIGS. 2-4, 7 and 8 illustrate four embodiments in which the detector is coupled to the substrate stage 20. However, other arrangements with coupling between the body and the detector exist.

Figure 2:
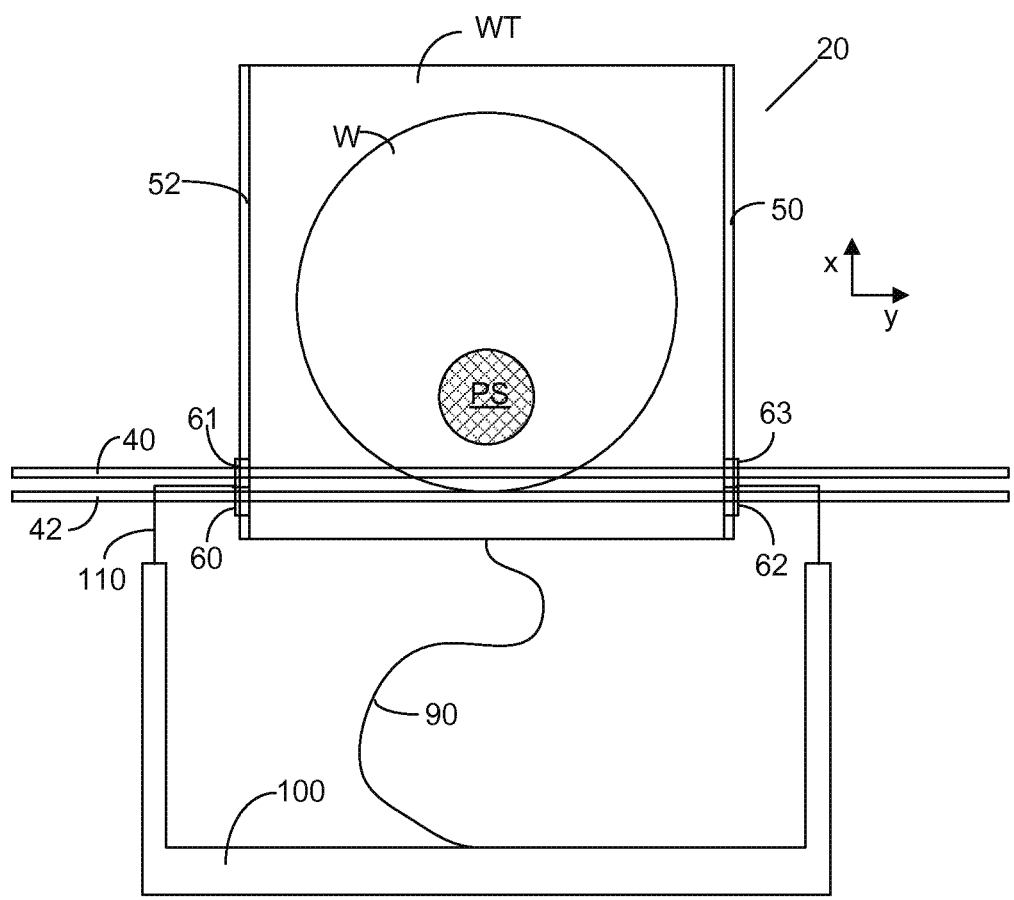
FIG. 2 depicts, in plan, a system for detecting motion of a body according to an embodiment of the present invention.

FIG. 2 illustrates an embodiment of the present invention in plan. Features have been omitted for clarity. A first grating 40 is mounted substantially stationary relative to the metrology frame MF (illustrated in FIG. 1 but not FIG. 2, for clarity). In an embodiment the first grating 40 is elongate in a first direction, for example the y direction, as illustrated. In an embodiment a further first grating 42 is provided. In an embodiment the further first grating 42 is elongate in a direction parallel to the first direction. The first and further first grating 40, 42 may be separate or part of the same object.

In an embodiment a second grating 50 is mounted on the substrate table WT. In an embodiment the second grating 50 is elongate in a second direction. In an embodiment the second grating is elongate in a second direction orthogonal to the first direction. In an embodiment the second direction is the x direction. In an embodiment a further second grating 52 is provided mounted to the substrate table WT. In an embodiment the further second grating 52 is provided at a position distant from the second grating 50, for example along an opposite edge of the substrate table WT to the second grating 50. The second and further second grating 50, 52 may be separate or part of the same object.

In an embodiment at least one detector 60 is provided. In an embodiment the detector 60 comprises an emitter and sensor as described above. In an embodiment more than one detector 60 is provided. As illustrated in FIG. 2 in an embodiment a detector 60, 61, 62, 63 is provided at each of the intersections of the first 40, 42 and second 50, 52 gratings. Fewer than four detectors may be used. For example in the case that only one first grating is used, only two detectors 60, 62 may be used. For the case where only one first grating 40 and one second grating 50 are used, only one detector 62 may be used. In the case where the first grating 40 and further first grating 42 are used and only the second grating 50 is used (and not the further second grating 52) two detectors 62, 63 may be used. In an embodiment with four gratings 40, 42, 50, 52, only three or two detectors 60, 61, 62, 63 may be used.

In an embodiment, as illustrated, more than one detector may be connected together and moved together. In the example of FIG. 2 detectors 60 and 61 (sharing the further second grating 52) are moved together and detector 62 and 63 (sharing the second grating 50) are moved together.

Each detector 60, 61, 62, 63 can take measurements which can be used by a controller 500 (not shown) to determine translational movement in the x, y and z directions and optionally in the Rx and Ry rotational directions as well as optionally rotation in the Rz direction.

In an embodiment each of the detectors 60, 61, 62, 63 send signals to the controller 500. The controller uses the signals to determine movement in 3 degrees of freedom (for example movement in the x, y and z directions) for each detector which leads to 12 pieces of information. Those 12 pieces of information can be used to calculate the position of the substrate table WT in 6 degrees of freedom as well as to calculate deformation of the metrology frame MF and the substrate table WT (for example torsion of the substrate table WT).

The way in which the one or more detectors 60, 61, 62, 63 are coupled to the substrate stage 20 and constrained in the x axis relative to the first grating 40 and moved in the y axis relative to the first grating 40 will now be described with reference to FIG. 2 and to FIG. 3 which is a cross-sectional illustration of what is shown in FIG. 2.

In an embodiment the detector 60, 61, 62, 63 is constrained by a body mounted guide 120 in at least one of 5 degrees of freedom relative to the substrate stage 20. Those 5 degrees of freedom, in the embodiment of FIG. 2, are the y, z, Rx, Rz, Ry directions relative to the substrate stage 20. In an embodiment the body mounted guide 120 is effective to constrain the detector 60, 61, 62, 63 in the x, z, Rx, Rz, Ry directions relative to the first grating 40. The body mounted guide 120 is attached to part of the substrate stage 20 thereby coupling the detector 60, 61, 62, 63 to the substrate stage 20.

In an embodiment the guide is in the form of a rail. In an embodiment the guide may include a bearing, for example a magnetic bearing, a gas bearing or a ball bearing. The substrate stage 20 may support the detector 60, 61, 62, 63, for example by a body mounted support. The body mounted support and body mounted guide may be the same component.

In an embodiment the position of the detectors in the x-direction may be constrained by a connection 110 between the detectors and a linear axis 100. The linear axis 100 moves only in a direction parallel to the first gratings 140. Thus, the detectors 60, 61, 62, 63 can be made to follow the first gratings 40, 42. The linear axis 100 is a body which follows the substrate stage 20 in the y direction. The linear axis 100 supports one or more conduits 90 (see FIG. 2). The conduits 90 are for the provision of utilities such as gas, electricity, control signals, detection signals to/from the substrate table WT. The at least one conduit 90 extends between the linear axis 100 and the substrate table WT and the purpose of the linear axis 100 is to reduce the forces applied by the conduits 90 to the substrate table WT.

Relative motion in the x-direction between the detectors 60, 61, 62, 63 and the substrate table WT will occur when the substrate table WT makes a motion in the x-direction. The linear axis 100 will constrain the motion of the detectors 60, 61, 52, 63 through the connection 110. The linear axis 100 can be seen as an actuator which is adapted to generate a force between the substrate stage 20 and the detector 60, 61, 62, 63. The linkage 110 is such as to maintain the position of the detector 60, 61, 62, 63 in the x axis relative to the first and further first grating 40, 42 whilst minimizing disturbance forces introduced onto the substrate table WT (by being compliant in directions other than the x direction).

In an embodiment the linear axis 100 can be seen as being a detector actuator which is adapted to generate a force between a third body (e.g. the frame (base frame BF) to which the linear axis 100 is coupled) and the detector 60, 61, 62, 63.

In an embodiment the linkage 110 constrains the position of the detector 60, 61, 62, 63 in the x direction. When the substrate stage 20 moves in the x direction, the linear axis 100 does not move in the x direction and the detectors 60, 61, 62, 63 will not move relative to the first gratings 40, 42, 50, 52. The substrate stage 20 (in particular the second positioner PW) does move and the detector 60, 61, 62, 63 is guided on the substrate stage 20 (in particular on the second positioner).

In an embodiment the linear axis 100 follows the motion of a balance mass which is used in positioning of the substrate table WT both in x, y an Rz directions. Therefore, some movement in the x direction of the linear axis, which is different to that of the metrology frame MF and first gratings 40, 42, can exist. This motion in the x direction of the linear axis may be only about 40 mm (the stroke of the balance mass). One solution is to increase the size of the first gratings by 40 mm. A preferred solution is to provide a small actuator to actuate the detector 60, 61, 62, 63 in the x direction relative to the linear axis 100. The actuator may be a linear motor type actuator.

Figure 3:
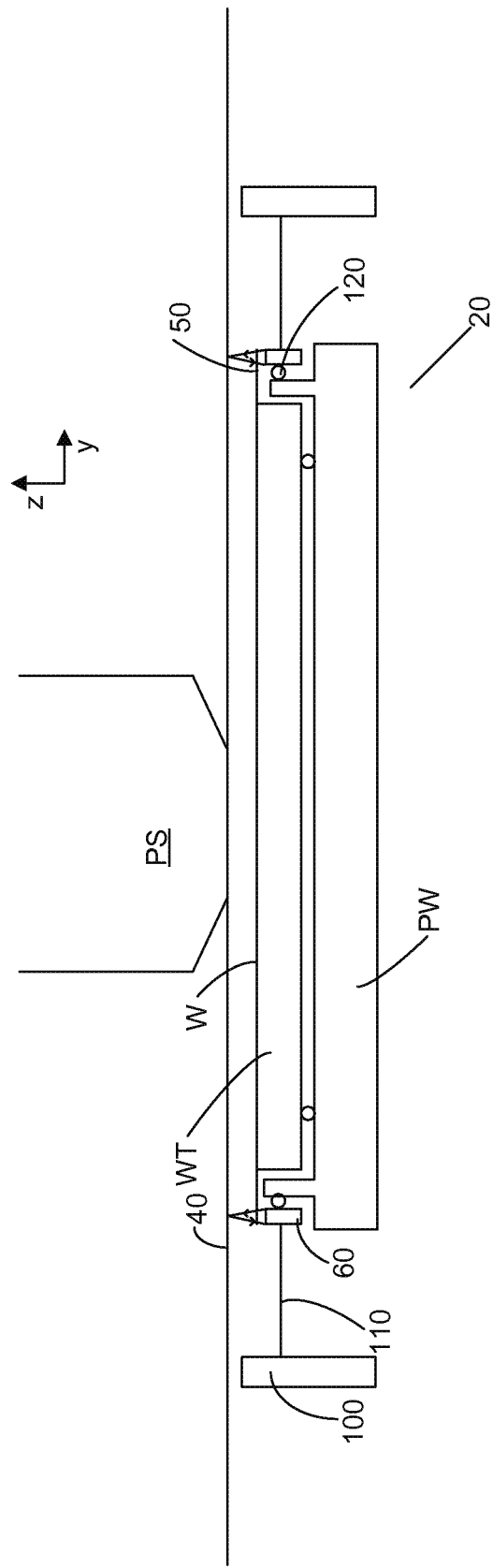
FIG. 3 depicts, in cross-section, the system for detecting motion of a body of FIG. 2.

As is most clearly seen in FIG. 3, the substrate stage 20 comprises a first module e.g. a substrate table WT and a second module e.g. a second positioner PW. The substrate table WT is moveable relative to the second positioner PW. Movement of the substrate table WT relative to the second positioner PW is for fine positioning (short movements) of the substrate table WT under the projection system PL. The second positioner PW is designed for long stroke movements and large movements relative to the frame of reference.

Preferably the detector 60, 61, 62, 63 is coupled to the second positioner PW. This is advantageous because any disturbance forces introduced by the detector 60, 61, 62, 63 being coupled to the substrate stage 20 are less likely to reach the substrate table WT and thereby the substrate W.

In an embodiment the body mounted guide 120 is adapted to couple the detector 60, 61, 62, 63 to the substrate stage 20 by constraining the movement of the detector 60, 61, 62, 63 relative to the substrate stage 20 in at least one of the six degrees of freedom excluding in a direction substantially parallel to the elongate direction of the second grating 50, 52. In an embodiment the at least one of the six degrees of freedom includes the y direction. In an embodiment the linkage 110 constrains movement of the detector 60, 61, 62, 63 relative to the metrology frame MF in at least one of the six degrees of freedom excluding in a direction substantially parallel to the elongate direction of the first grating 40, 42.

As the substrate table WT moves in the x direction, the combination of the guide 120 and the linkage 110 ensure that the detector 60, 61, 62, 63 remains under its corresponding intersection between the first and second gratings 40, 42, 50, 52. Some movement of the detector 60, 61, 62, 63 relative to the corresponding intersection is allowable so long as the detector can detect the one or more radiation beams diffracted at the first and second gratings 40, 42, 50, 52.

The weight of the detectors 60, 61, 62, 63 may be borne either by the substrate table WT (for example through the guide 120) or the linear axis 100. In the embodiment of FIGS. 2 and 3 the guide 120 is adapted to support the detector 60, 61, 62, 63 on the body. In an embodiment the weight of the detectors 60, 61, 62, 63 is borne by the linear axis 100 via the linkage 110.

The embodiment of FIGS. 2 and 3 can be seen as a system in which no dedicated actuators are required for maintaining the detector 60, 61, 62, 63 under the intersection of the first and second gratings 40, 42, 50, 52. The constraint of the detector 60, 61, 62, 63 relative to the substrate table WT in at least one of the six degrees of freedom excluding in a direction substantially parallel to the elongate direction of the second grating 50, 52 is achieved passively.

Figure 4:
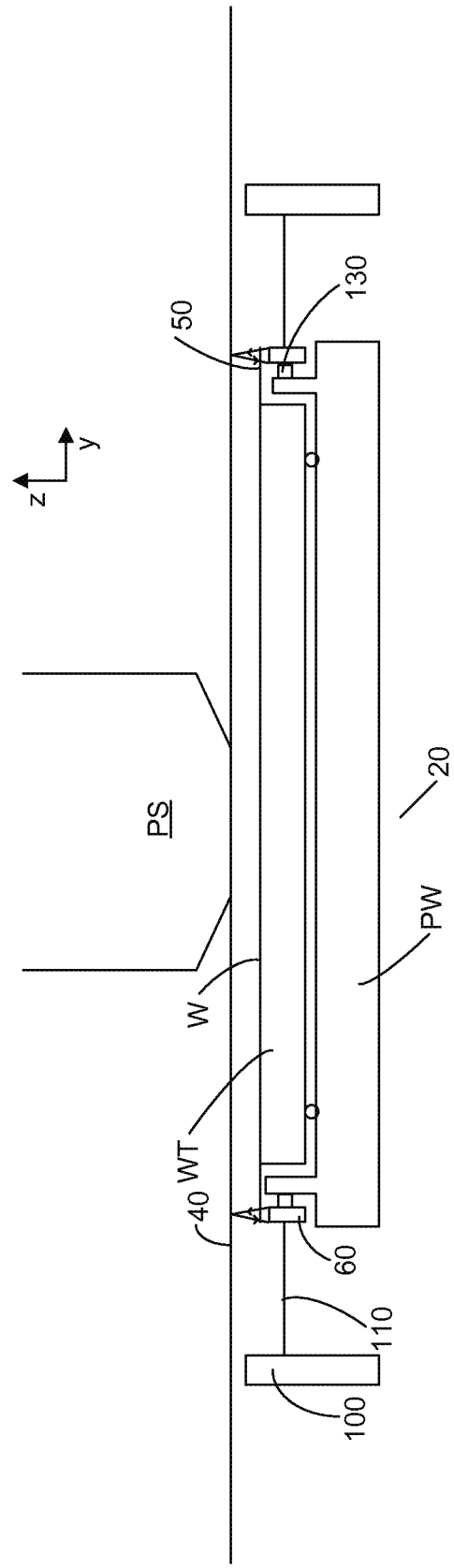
FIG. 4 depicts, in cross-section, a system for detecting motion of a body according to an embodiment of the present invention.

FIG. 4 illustrates another embodiment of a system for detecting motion of a body which is the same as the embodiment of FIGS. 2 and 3 except as described below.

In the embodiment of FIG. 4 the body mounted guide 120 is replaced by an actuator 130 which is adapted to couple the detector 60, 61, 62, 63 to the substrate table WT. The actuator 130 is adapted to move the detector 60, 61, 62, 63 relative to the substrate table WT and constrain the detector in at least one of the 5 degrees freedom relative to the substrate table WT as the bearing 120 of the FIGS. 2 and 3 embodiment does.

In an embodiment the x position relative to the frame of reference of the detector 60, 61, 62, 63 is controlled by the linkage 110 between the detectors 60, 61, 62, 63 and the linear axis 100. In another embodiment the linkage 110 is not required and the actuator 130 moves the detector 60, 61, 62, 63 in the x direction relative to the substrate table WT thereby to ensure that the detector 60, 61, 62, 63 maintains its position under the intersection of the first and second gratings 40, 42, 50, 52. In an embodiment the actuator 130 generates a force between the substrate stage 20 and the detector 60, 61, 62, 63.

In an embodiment the actuator 130 moves the detector 60, 61, 62, 63 relative to the substrate table WT in a direction substantially parallel to the elongate direction of the second grating 50, 52. In an embodiment the actuator 130 is only designed for moving the detector relative to the substrate table WT in a direction substantially parallel to the elongate direction of the second grating 50, 52. The detector 60, 61, 62, 63 is constrained in the other 5 degrees of freedom relative to the substrate table WT through the linkage 110 between the detector 60, 61, 62, 63 and the linear axis 100, for example.

In the embodiment of FIG. 4 the detector 60, 61, 62, 63 may be supported in the same way as in the embodiment of FIG. 2 and FIG. 3 except that the actuator 130 acts as the body mounted support. In an embodiment a body mounted support which is adapted to support the detector 60, 61, 62, 63 on the body (and thereby couple the detector 60, 61, 62, 63 to the body) may be provided separate from the body mounted guide 120 or the actuator 130. For example, a separate support may comprise an air bearing, magnetic bearing or ball bearing between a surface of the detector 60, 61, 62, 63 (e.g. a bottom surface) and a surface of the long stroke module 80 (for example an upwardly facing surface of the long stroke module 80).

In the embodiment of FIG. 4 the long stroke module 80 is adapted to move the detector 60, 61, 62, 63 in a direction substantially parallel to the direction in which the first grating 40, 42 is elongate, and not by the linkage 110. The linkage 110 may be present to constrain movement of the detector 60, 61, 62, 63 relative to the substrate table WT as described above.

Figure 5:
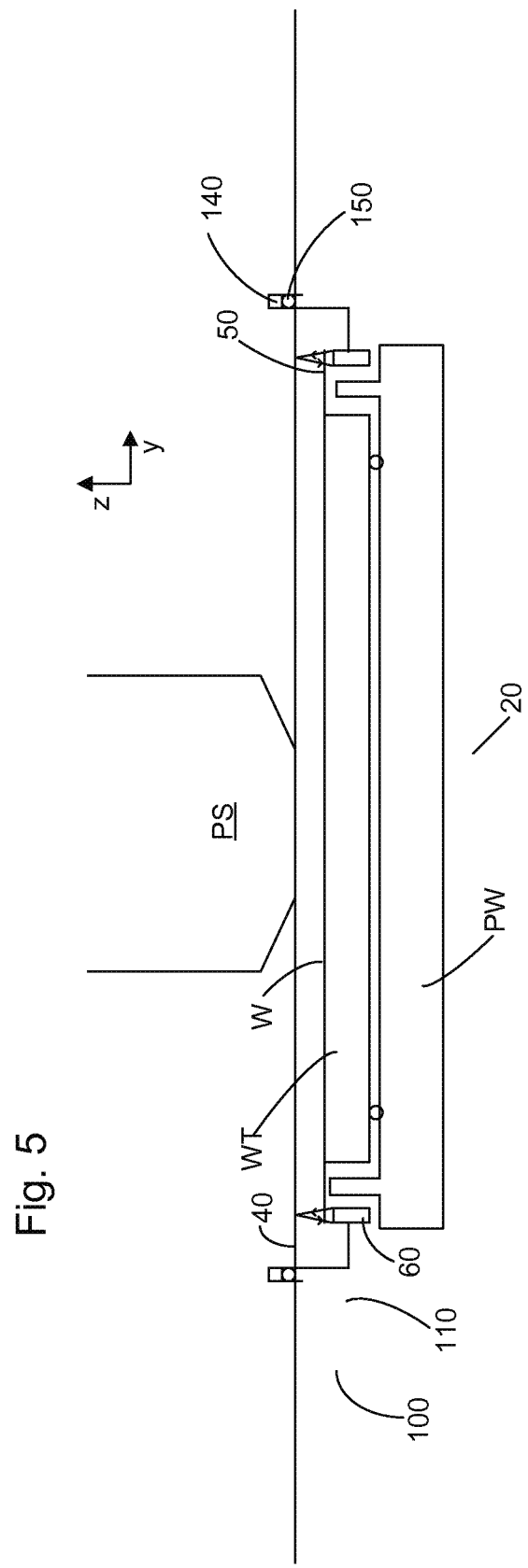
FIG. 5 depicts, in cross-section, a system for detecting motion of a body according to an embodiment of the present invention.

FIG. 5 illustrates an embodiment which is the same as the foregoing embodiments except as described below.

In the embodiment of FIG. 5 a guide 150 is provided to constrain movement of the detector 60, 61, 62, 63 relative to the substrate table WT in at least one of the six degrees of freedom excluding in a direction substantially parallel to the elongate direction of the second grating 50, 52. An actuator 140 is provided for actuating the detectors 60, 61, 62, 63 in the y direction relative to the first grating 40.

As illustrated in FIG. 5 there is no coupling between the detector 60, 61, 62, 63 and the substrate stage 20. In an embodiment there may be a coupling between the detector 60, 61, 62, 63 and the substrate stage 20. The coupling may be in the form of a support, for example. In an embodiment the coupling may be a guide for constraining movement of the detector 60, 61, 62, 63 relative to the substrate table WT in at least one of the six degrees of freedom excluding in a direction substantially parallel to the elongate direction of the second grating 50, 52.

The guide 150 may be similar to the guides of the other embodiments. In an embodiment, the actuator 140 actuates the detector 60, 61, 62, 63 in the y axis so as to maintain the position of the detector 60, 61, 62, 63 under the intersection of the first and second gratings 40, 42, 50, 52. The actuator 140 may also constrain movement of the detector 60, 61, 62, 63 relative to the substrate table WT in at least one of the six degrees of freedom excluding in a direction substantially parallel to the elongate direction of the second grating 50, 52.

In an embodiment the guide 150 is adapted to guide the detector 60, 61, 62, 63 in a direction substantially parallel to the elongate direction of the first grating 40, 42. In an embodiment, the actuator 140 is adapted to move the detector 60, 61, 62, 63, relative to the first grating in a direction substantially parallel to the elongate direction of the first grating 40, 42.

In an embodiment the guide 150 is connected to a frame (for example the metrology frame MF or the base frame BF) to which the first gratings 40, 42 are also attached. In an embodiment the guide 150 is connected to the first grating 40, 42 as illustrated in FIG. 6.

Figure 7:
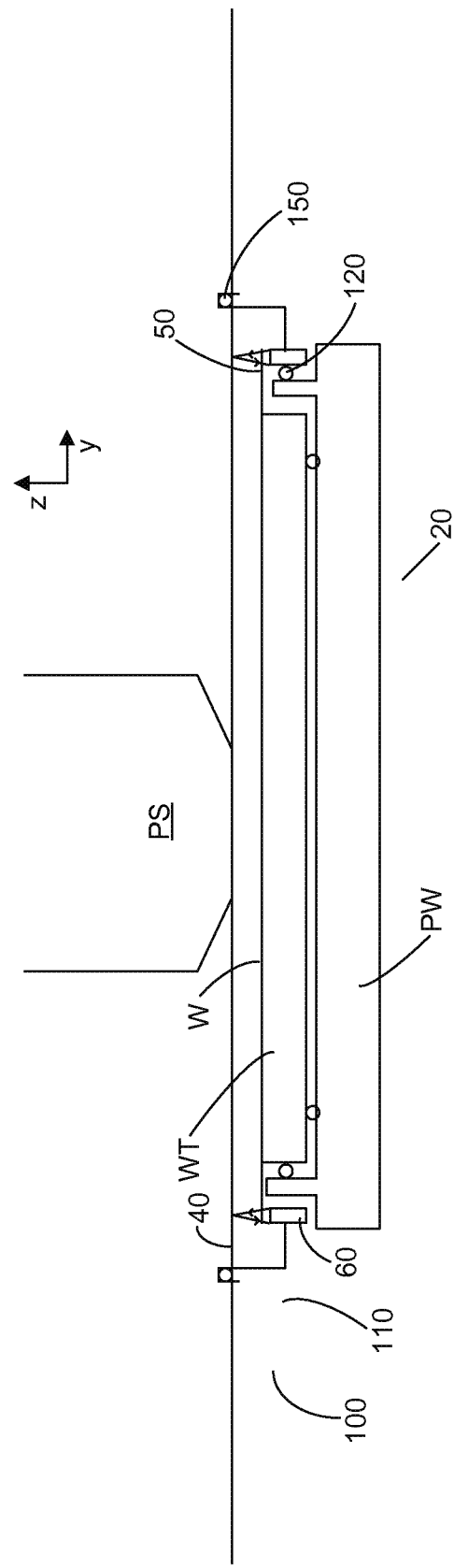
FIG. 7 depicts, in cross-section, a system for detecting motion of a body according to an embodiment of the present invention.

FIG. 7 illustrates an embodiment which is the same as the preceding embodiments except as described below.

Figure 6:
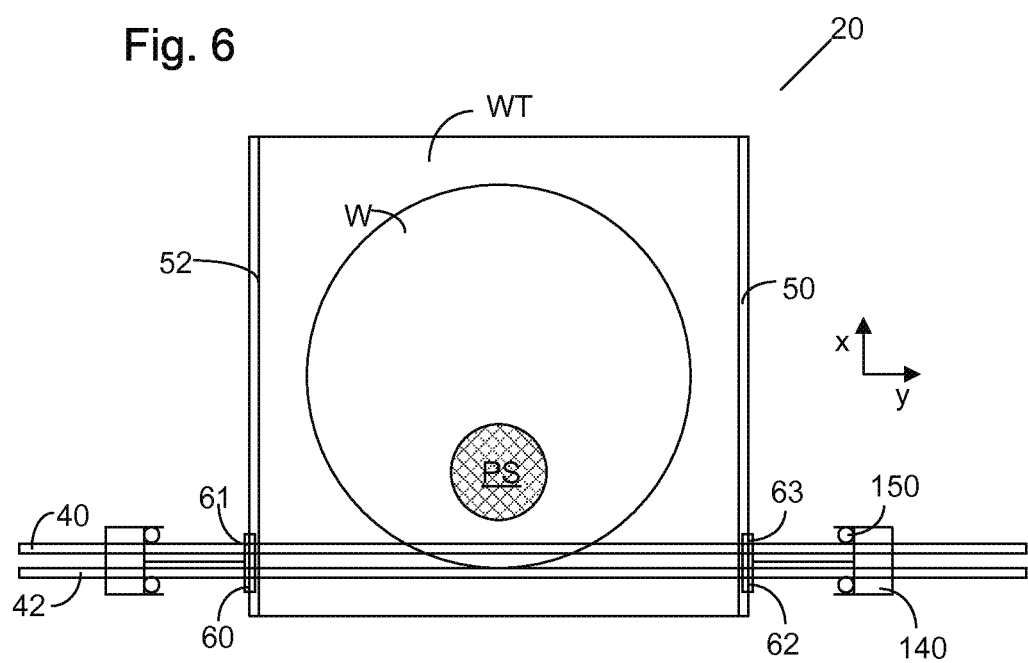
FIG. 6 depicts, in plan, the system for detecting motion of FIG. 5.

The same or a similar guide 150 to that provided in the FIGS. 5 and 6 embodiment is provided in the FIG. 7 embodiment. However, no actuator is provided. Instead, a bearing 120 similar or the same to the bearing 120 to the embodiments of FIGS. 2 and 3 is provided. Therefore, movement of the detector 60, 61, 62, 63 is achieved due to movement of the substrate stage 20. This is a completely passive system.

The guide 150 constrains movement of the detector 60, 61, 62, 63 in the y direction relative to the first grating 40 and the bearing 120 allows movement of the detector 60, 61, 62, 63 relative to the substrate table WT in the x direction. The movement in the y direction relative to the first grating 40 is achieved by the coupling to the substrate stage 20. The movement in the x direction relative to the substrate table WT is achieved by virtue of the guide 150. One or both of the body mounted guide 120 and guide 150 may constrain the detector 60, 61, 62, 63 in the other 5 degrees of freedom relative to the frame of reference. The embodiment of FIG. 7 is a passive system and requires no dedicated actuator for the detector 60, 61, 62, 63.

Figure 8:
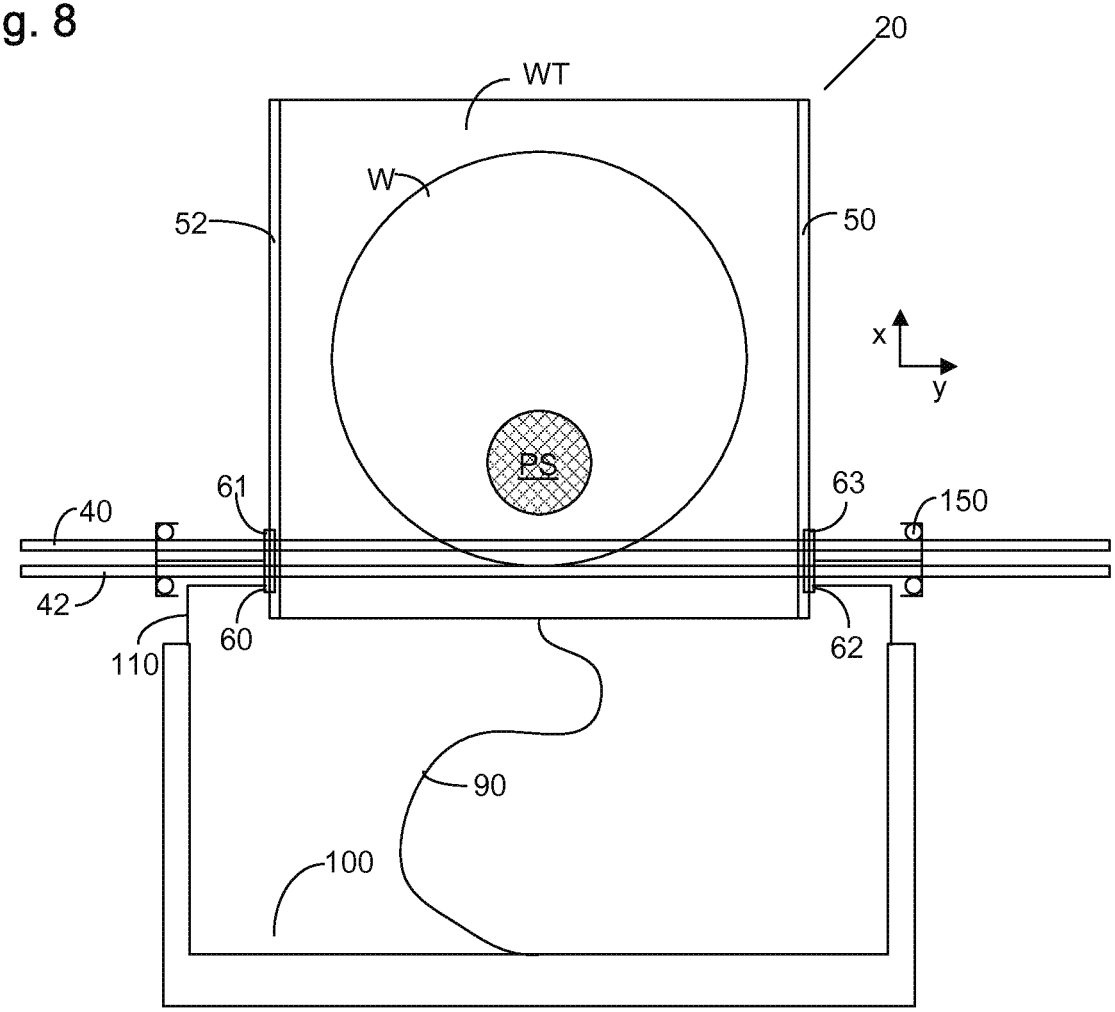
FIG. 8 depicts, in plan, a system for detecting motion of a body according to an embodiment of the present invention.

The embodiment of FIG. 8 is the same as the embodiment of FIG. 7 except as described below. The FIG. 8 embodiment includes the coupling 110 between the detector 60, 61, 62, 63 and the linear axis 100 of the embodiment of FIGS. 2 and 3 and the guide 150 of the embodiment of FIGS. 5 and 6. In an embodiment there is no coupling between the detector 60, 61, 62, 63 and the substrate stage 20. In an alternative embodiment there may be a coupling between the detector 60, 61, 62, 63 and the substrate stage 20, for example in the form of a body mounted support or a body mounted guide.

In an embodiment of FIG. 8 the linkage 110 is effective to move the detector 60, 61, 62, 63 in the y direction relative to the first grating 40. In an embodiment the linkage 110 is also effective to maintain the position of the detector 60, 61, 62, 63 in a position under the intersect of the first and second gratings (i.e. constrain the detector 60, 61, 62, 63 in (at least one of the) 6 degrees of freedom relative to the substrate table WT other than the x direction. The presence of the linkage 110 is optional). In an embodiment the guide 150 constrains the detector 60, 61, 62, 63 in 5 degrees of freedom relative to the frame of reference. In an alternative embodiment the linkage 110 and guide 150 constrain the detector 60, 61, 62, 63 each in fewer than 5 degrees of freedom relative to the frame of reference but together in 5 degrees of freedom relative to the frame of reference.

In an embodiment the first and second grating 40, 42, 50, 52 are two dimensional gratings which contain information for both horizontal degrees of freedom and optionally the z direction. In an embodiment a second substrate stage 20 is provided. The second substrate stage 20 is the same as the first substrate stage 20 and has the same system for detecting motion of a body. The first grating of the second substrate stage 20 is placed on the opposite side of the projection system PS to those of the first substrate stage 20. This is positioned such as to allow swapping of substrate stage 20 under the projection system PS. The first grating of the second substrate stage 20 is substantially parallel to the first grating of the second substrate stage 20.

In an embodiment first and second substrate stages use the same first grating 40, 42 in their respective systems for detecting motion of a body. In such a circumstance it may be necessary to decouple a substrate stage from the system for detecting motion of a body (for example by retracting a detector 60, 61, 62, 63) and monitoring the position of the substrate stage 20 using a different system (for example a laser interferometer).

Because the position of the detectors 60, 61, 62, 63 is fixed in the x direction relative to the frame of reference, it is possible that the detectors 60, 61, 62, 63 do not comprise an emitter. Instead, a beam along the y direction may be provided by a fixed emitter and reflected by a reflective surface on the detector 60, 61, 62, 63, for example, through the second grating (which is transmissive in an embodiment) onto the first grating, where it is diffracted and reflected and optionally passes back through the second grating to the detector 60, 61, 62, 63.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is;

1. A system for detecting motion of a body, the system comprising:
   a body comprising a first module and a second module, the first module being moveable relative to the second module;
   a first grating configured to be stationary relative to a frame of reference;
   a second grating mounted on the first module; and
   a detector configured to receive one or more radiation beams diffracted from the first and second gratings to detect motion of the body relative to the frame of reference,
   wherein the detector is coupled to the body and moveable relative to the body.

2. The system of claim 1, wherein a body mounted guide is configured to constrain the movement of the detector relative to the body in at least one of the six degrees of freedom excluding in a direction parallel to an elongate direction of the second grating.

3. The system of claim 1, wherein a body mounted support is configured to support the detector on the body.

4. The system of claim 1, wherein a bearing is configured to couple the body to the detector are coupled by a bearing.

5. The system of claim 1, further comprising a grating guide configured to:
   be stationary relative to the first grating; and
   constrain movement of the detector relative to the first grating in at least one of the six degrees of freedom excluding in a direction parallel to an elongate direction of the first grating.

6. The system of claim 1, further comprising a detector actuator configured to move the detector relative to the body in a direction parallel to an elongate direction of the second grating.

7. The system of claim 6, wherein the detector actuator is configured to generate a force between the body and the detector.

8. The system of claim 6, wherein the detector actuator is configured to generate a force between a third body and the detector.

9. The system of claim 1, wherein the detector is moveable relative to the body by passive action of a guide.

10. The system of claim 1, wherein, in use, the detector is under the first and second gratings and the second grating is under the first grating.

11. A system for detecting motion of a body, the system comprising:
- a body;
- a first grating configured to be stationary relative to a frame of reference;
- a second grating mounted on the body;
- a detector configured to receive one or more radiation beams diffracted from the first and second gratings to detect motion of the body relative to the frame of reference;
- a guide configured to guide the detector in a direction parallel to an elongate direction of the first grating; and
- an actuator configured to move the detector in a direction parallel to the elongate direction of the first grating.

12. The system of claim 11, further comprising a third grating configured to be stationary relative to the frame of reference and parallel to the first grating.

13. The system of claim 12, further comprising another detector configured to receive one or more radiation beams diffracted from the third grating and second grating to detect motion of the body relative to the frame of reference.

14. The system of claim 12, wherein the first grating and the third grating are part of the same object.

15. The system of claim 11, further comprising a fourth grating mounted along a first edge of the body, the first edge being opposite to a second edge of the body on which the second grating is mounted.

16. A lithographic apparatus comprising;
- a support configured to hold a patterning device, the patterning device being capable of imparting a radiation beam with a pattern in its cross-section to form a patterned radiation beam;
- a projection system configured to project the patterned radiation beam onto a target portion of a substrate;
- a frame of reference configured to be stationary relative to the projection system;
- a body comprising a first module and a second module, the first module being moveable relative to the second module;
- a first grating configured to be stationary relative to the frame of reference;
- a second grating mounted on the first module; and
- a detector arranged to receive one or more radiation beams diffracted at the first and second gratings to detect motion of the body relative to the frame of reference,
- wherein the detector is coupled to the body and moveable relative to the body.

17. The lithographic apparatus of claim 16, wherein the body is a substrate stage for supporting a substrate.

* * * * *